(12) United States Patent
Tomiha et al.

(10) Patent No.: US 10,288,714 B2
(45) Date of Patent: May 14, 2019

(54) MAGNETIC RESONANCE IMAGING APPARATUS AND RF COIL

(71) Applicant: TOSHIBA MEDICAL SYSTEMS CORPORATION, Otawara-Shi (JP)

(72) Inventors: Sadanori Tomiha, Nasushiobara (JP); Koji Akita, Yokohama (JP)

(73) Assignee: Toshiba Medical Systems Corporation, Otawara-shi (JP)

( * ) Notice: Subject to any disclaimer, the term of this patent is extended or adjusted under 35 U.S.C. 154(b) by 632 days.

(21) Appl. No.: 14/848,874

(22) Filed: Sep. 9, 2015

(65) Prior Publication Data
US 2016/0069969 A1    Mar. 10, 2016

(30) Foreign Application Priority Data
Sep. 9, 2014   (JP) .................................. 2014-183592

(51) Int. Cl.
*G01R 33/565* (2006.01)
*G01R 33/36* (2006.01)

(52) U.S. Cl.
CPC ... *G01R 33/56554* (2013.01); *G01R 33/3692* (2013.01); *G01R 33/3621* (2013.01)

(58) Field of Classification Search
CPC .......... G01R 33/56554; G01R 33/3692; G01R 33/3621
See application file for complete search history.

(56) References Cited

U.S. PATENT DOCUMENTS 8,704,522 B2 *   4/2014   Akita ................. G01R 33/3692
                                                                         324/318

FOREIGN PATENT DOCUMENTS

| JP | 2010-29644 A | 2/2010 |
|---|---|---|
| JP | 2011-193989 | 10/2011 |
| JP | 2012-85970 | 5/2012 |

OTHER PUBLICATIONS

Office Action dated May 29, 2018 in Japanese Patent Application No. 2014-183592.

* cited by examiner

*Primary Examiner* — Gregory H Curran
(74) *Attorney, Agent, or Firm* — Oblon, McClelland, Maier & Neustadt, L.L.P.

(57) ABSTRACT

In a magnetic resonance imaging apparatus, a transmission RF coil is configured to emit an RF pulse generated by using a first clock. In addition to an echo signal emitted from a patient, a reception RF coil is configured to further receive the RF pulse emitted by the transmission RF coil and configured to transmit, via a wireless communication, a multiplexed signal in which the echo signal digitalized by using a second clock, the RF pulse, and the second clock are multiplexed together. Wireless receiving circuitry is configured to receive the multiplexed signal via a wireless communication. Correcting circuitry is configured to correct the phase of the echo signal on the basis of the RF pulse and the second clock restored from the multiplexed signal received via the wireless communication. Reconstructing circuitry is configured to reconstruct an image by using the corrected echo signal.

14 Claims, 7 Drawing Sheets

MAGNETIC RESONANCE IMAGING APPARATUS AND RF COIL

CROSS-REFERENCE TO RELATED APPLICATION

This application is based upon and claims the benefit of priority from Japanese Patent Application No. 2014-183592, filed on Sep. 9, 2014; the entire contents of which are incorporated herein by reference.

FIELD

Embodiments described herein relate generally to a magnetic resonance imaging apparatus and a Radio Frequency (RF) coil.

BACKGROUND

Magnetic Resonance Imaging apparatuses (hereinafter, "MRI apparatuses") are configured to emit Radio Frequency (RF) pulses to an examined subject (hereinafter, "patient") and configured to receive echo signals emitted from the patient due to the emission of the RF pulses. Further, by analyzing the received echo signals, the MRI apparatuses are configured to take MR images of the patient.

In recent years, a method has been proposed by which communications between a device on the coil side that receives the echo signals and a device on the system side (the MRI apparatus main body side) that analyzes the echo signals are realized with wireless communications. In that situation, the device provided on the coil side may have installed therein an oscillator configured to generate a clock, separately from an oscillator provided on the system side. The clocks generated by the oscillators each have a frequency that is unique to the corresponding oscillator. For this reason, there is a frequency error between the clock provided on the coil side and the clock provided on the system side.

DETAILED DESCRIPTION

A magnetic resonance imaging apparatus according an embodiment includes a transmission RF coil, a reception RF coil, wireless receiving circuitry, correcting circuitry, and reconstructing circuitry. The transmission RF coil is configured to emit an RF pulse generated by using a first clock. In addition to an echo signal emitted from a patient, the reception RF coil is configured to further receive the RF pulse emitted by the transmission RF coil and configured to transmit, via a wireless communication, a multiplexed signal in which the echo signal digitalized by using a second clock, the RF pulse, and the second clock are multiplexed together. The wireless receiving circuitry is configured to receive the multiplexed signal via a wireless communication. The correcting circuitry is configured to correct the phase of the echo signal on the basis of the RF pulse and the second clock restored from the multiplexed signal received via the wireless communication. The reconstructing circuitry is configured to reconstruct an image by using the corrected echo signal.

Exemplary embodiments of a magnetic resonance imaging apparatus and an RF coil will be explained below, with reference to the accompanying drawings.

First Embodiment

Figure 1:
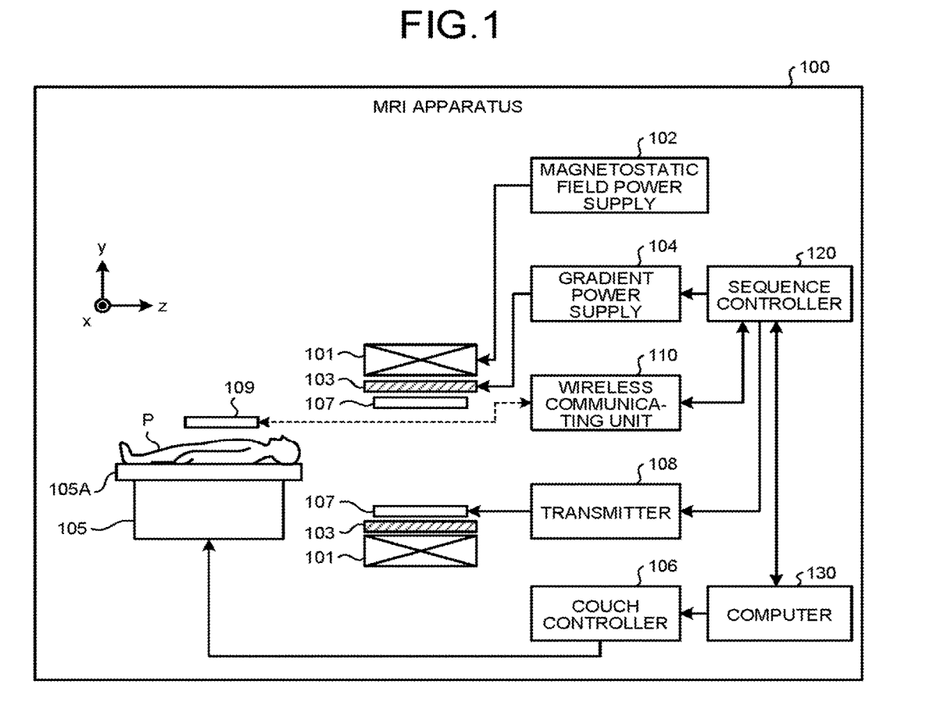
FIG. 1 is a diagram of an MRI apparatus according to a first embodiment.

FIG. 1 is a diagram of an MRI apparatus 100 according to a first embodiment. In the following sections, magnetic resonance imaging apparatuses will be referred to as MRI apparatuses.

As illustrated in FIG. 1, the MRI apparatus 100 includes a magnetostatic field magnet 101, a magnetostatic field power source 102, a gradient coil 103, a gradient power source 104, a couch 105, a couch controlling unit 106, a transmission RF coil 107, a transmitting unit 108, a reception RF coil 109, a wireless communicating unit 110, a sequence controlling unit 120, and a computer 130. The MRI apparatus 100 does not include a patient P (e.g., a human body). Further, the configuration illustrated in FIG. 1 is merely an example.

The magnetostatic field magnet 101 is a magnet formed substantially in the shape of a hollow circular cylinder and is configured to generate a magnetostatic field in the space on the inside thereof. The magnetostatic field magnet 101 may be configured by using, for example, a superconductive magnet and is configured to be excited by receiving a supply of electric current from the magnetostatic field power source 102. The magnetostatic field power source 102 is configured to supply the electric current to the magnetostatic field magnet 101. Alternatively, the magnetostatic field magnet 101 may be configured by using a permanent magnet. In that situation, the MRI apparatus 100 does not necessarily have to include the magnetostatic field power source 102. Further, the magnetostatic field power source 102 may be provided separately from the MRI apparatus 100.

The gradient coil 103 is a coil that is formed substantially in the shape of a hollow circular cylinder and is disposed on the inside of the magnetostatic field magnet 101. The gradient coil 103 is formed by combining three coils corresponding to x-, y-, and z-axes that are orthogonal to one another. These three coils individually receive a supply of electric current from the gradient power source 104 and generate gradient magnetic fields of which the magnetic field intensities change along the x-, y-, and z-axes. The gradient magnetic fields on the x-, y-, and z-axes generated by the gradient coil 103 are, for example, a slice encoding gradient magnetic field $G_{SE}$ (or a slice selecting gradient magnetic field $G_{SS}$), a phase encoding gradient magnetic field $G_{PE}$, and a frequency encoding gradient magnetic field $G_{RO}$. The gradient power source 104 is configured to supply the electric current to the gradient coil 103.

The couch 105 includes a couch top 105A on which the patient P is placed. Under control of the couch controlling unit 106, while the patient P is placed thereon, the couch top 105A is inserted into the hollow (i.e., an image taking opening) of the gradient coil 103. Normally, the couch 105 is provided so that the longitudinal direction thereof extends parallel to the central axis of the magnetostatic field magnet 101. Under control of the computer 130, the couch controlling unit 106 is configured to drive the couch 105 so as to move the couch top 105A in longitudinal directions and in up-and-down directions.

The transmission RF coil 107 is configured to emit a Radio Frequency (RF) pulse supplied thereto from the transmitting unit 108 and to generate a radio frequency magnetic field. For example, the transmission RF coil 107 is a Whole Body (WB) coil disposed on the inside of the gradient coil 103. The transmitting unit 108 is configured to supply the RF pulse corresponding to a Larmor frequency determined by the type of targeted atoms and the magnetic field intensities, to the transmission RF coil 107.

The reception RF coil 109 is configured to receive echo signals emitted from the patient P due to an influence of the radio frequency magnetic field generated by the transmission RF coil 107. For example, the reception RF coil 109 may be configured by using a Phased Array Coil (FAC) attached to the body surface of the patient, or the like.

In this situation, the reception RF coil 109 according to the first embodiment transmits the received echo signals via a wireless communication. For example, when having received the echo signals, the reception RF coil 109 generates Magnetic Resonance (MR) data by performing an Analog/Digital (A/D) conversion process on the received echo signals. Further, the reception RF coil 109 transmits the generated MR data to the wireless communicating unit 110 provided on the MRI apparatus 100 main body side, via the wireless communication. The wireless communicating unit 110 is configured to output the MR data received from the reception RF coil 109 to the sequence controlling unit 120.

In the first embodiment, an example will be explained in which the WB coil realized with the transmission RF coil 107 emits the RF pulse, whereas the PAC realized with the reception RF coil 109 receives the echo signals. However, this configuration is merely an example. For instance, the reception RF coil 109 may further be provided with a function of transmitting an RF pulse, such as a head coil. In other words, it is sufficient if the reception RF coil 109 is an RF coil provided with at least the receiving function and the wireless communication function. Further, the transmission RF coil 107 may further be provided with a function of receiving the echo signals.

The sequence controlling unit 120 is configured to perform an image taking process on the patient P, by driving the gradient power source 104, the transmitting unit 108, and the wireless communicating unit 110, on the basis of sequence information transmitted from the computer 130. In this situation, the sequence information is information that defines a procedure for performing the image taking process. The sequence information defines: the intensity of the electric current to be supplied to the gradient coil 103 and the timing with which the electric current is to be supplied; the intensity of the RF pulse to be supplied by the transmitting unit 108 to the transmission RF coil 107 and the timing with which the RF pulse is to be applied; the timing with which the echo signals are to be detected by the wireless communicating unit 110, and the like. For example, the sequence controlling unit 120 may be configured by using an integrated circuit such as an Application Specific Integrated Circuit (ASIC) or a Field Programmable Gate Array (FPGA) or an electronic circuit such as a Central Processing Unit (CPU) or a Micro Processing Unit (MPU).

Further, when having received the MR data from the wireless communicating unit 110 as a result of the image taking process performed on the patient P by controlling the gradient power source 104, the transmitting unit 108, and the wireless communicating unit 110, the sequence controlling unit 120 transfers the received MR data to the computer 130.

The computer 130 is configured to exercise overall control of the MRI apparatus 100, to generate an MR image, and the like. For example, the computer 130 is configured to cause the sequence controlling unit 120 to execute an image taking sequence on the basis of image taking conditions that are input by an operator. Further, the computer 130 is configured to reconstruct an image on the basis of the MR data transmitted thereto from the sequence controlling unit 120. The computer 130 stores the reconstructed image into a storage unit, causes a display unit to display the reconstructed image, or the like. The computer 130 may be, for example, an information processing apparatus such as a computer device.

Incidentally, when the reception RF coil 109 provided with the wireless communication function is used, the reception RF coil 109 may have installed therein an oscillator configured to generate a clock, separately from an oscillator provided on the system side (the MRI apparatus main body side). The clocks generated by the oscillators each have a frequency that is unique to the corresponding oscillator. For this reason, there is a frequency error between the clock on the coil side (hereinafter, "coil clock") and the clock on the system side (hereinafter, "system clock").

Figure 2:
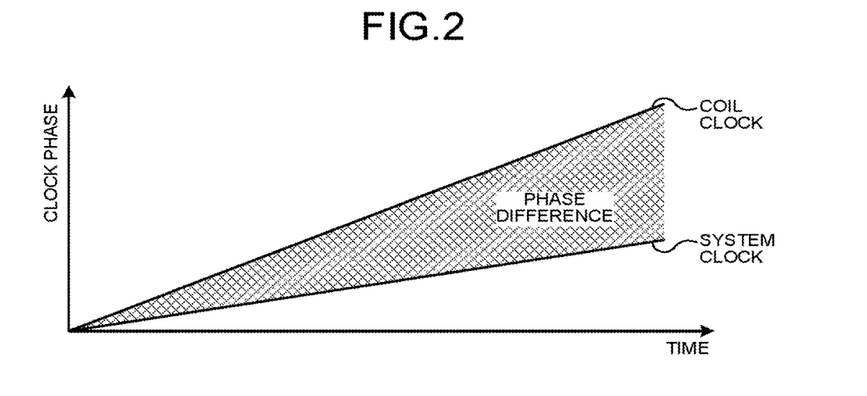
FIG. 2 is a drawing for explaining a frequency error between a coil clock and a system clock.

FIG. 2 is a drawing for explaining the frequency error between the coil clock and the system clock. In FIG. 2, the horizontal axis expresses time, whereas the vertical axis expresses a clock phase. As illustrated in FIG. 2, because the coil clock and the system clock each have a unique frequency, the clock phase of each of the clocks changes on a constant slope. For this reason, even if the clock phases of the coil clock and the system clock are matched once, there will be a phase difference in a short period of time. Further, the phase difference grows larger over the course of time.

As explained above, the frequency error is present between the coil clock and the system clock. In MRI apparatuses, because information such as position information is transformed into the phases of the echo signals, when there are phase differences in the echo signals due to the frequency error, there is a possibility that the image quality of MR images may be degraded.

To cope with this situation, the MRI apparatus 100 according to the first embodiment has a configuration as described below, for the purpose of preventing the image quality from being degraded by the frequency error between the clocks.

More specifically, the MRI apparatus 100 according to the first embodiment is configured to detect a phase difference between the coil clock and the system clock at the times when RF pulses are emitted, by using the difference between emission times of the RF pulses emitted from the transmission RF coil 107 and reception times when the emitted RF pulses are received by the reception RF coil 109. Further, by multiplexing the coil clock on the echo signals and the RF pulses and transmitting the multiplexed result to the system side during the time period when the pulse sequence is executed, the MRI apparatus 100 detects the phase difference between the coil clock and the system clock. A configuration to realize this function will be explained below.

Figure 3:
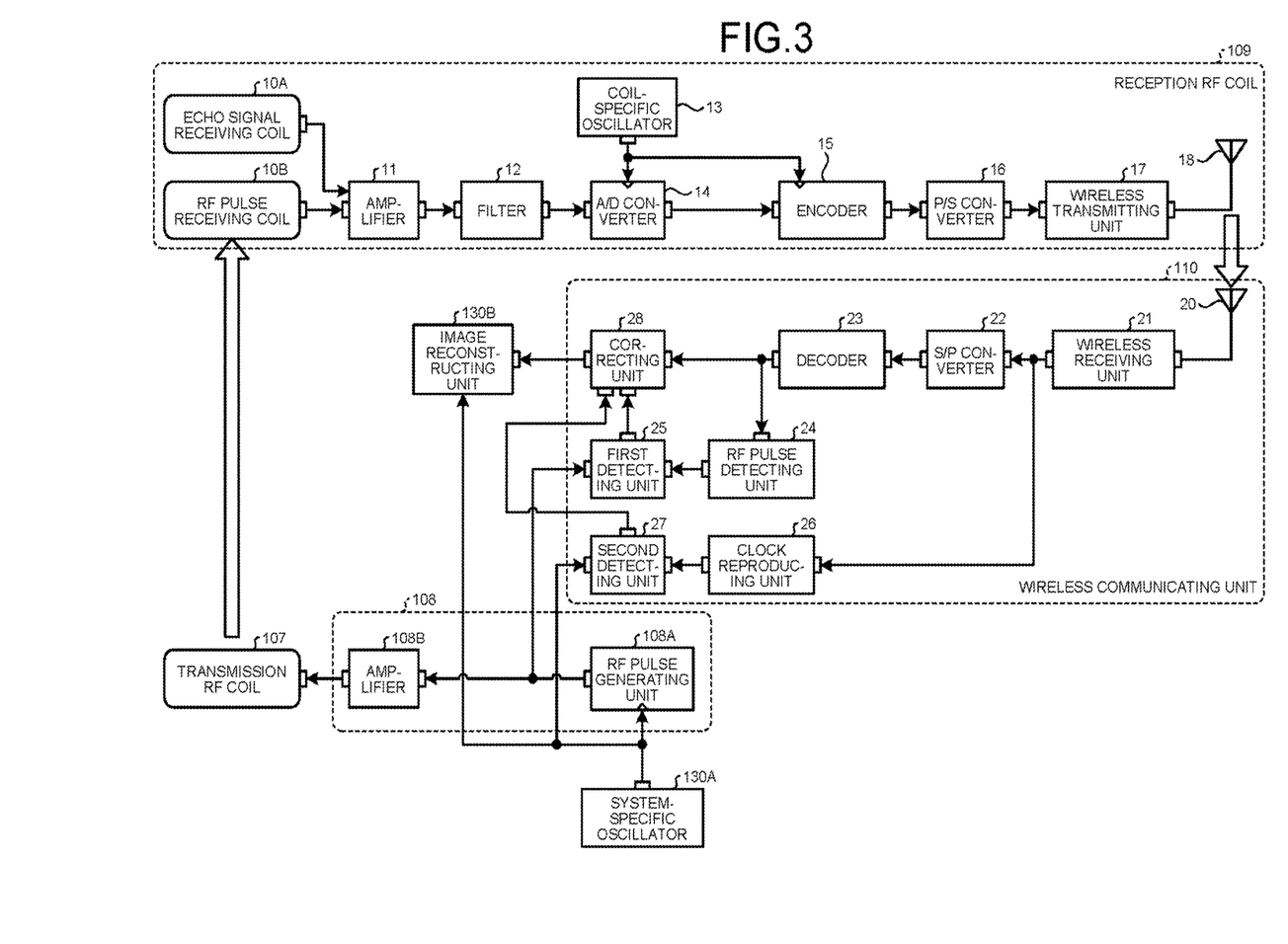
FIG. 3 is a diagram of a detailed configuration of the MRI apparatus according to the first embodiment.

FIG. 3 is a diagram of a detailed configuration of the MRI apparatus 100 according to the first embodiment. As illustrated in FIG. 3, the transmitting unit 108 includes an RF pulse generating unit 108A and an amplifier 108B. Further, the reception RF coil 109 includes an echo signal receiving coil 10A, an RF pulse receiving coil 10B, an amplifier 11, a filter 12, a coil-specific oscillator 13, an Analog/Digital (A/D) converting unit 14, an encoder 15, a Parallel/Serial (P/S) converting unit 16, a wireless transmitting unit 17, and a transmission antenna 18. Further, the wireless communicating unit 110 includes a reception antenna 20, a wireless receiving unit 21, a Serial/Parallel (S/P) converting unit 22, a decoder 23, an RF pulse detecting unit 24, a first detecting unit 25, a clock reproducing unit 26, a second detecting unit 27, and a correcting unit 28. Further, a system-specific oscillator 130A and an image reconstructing unit 130B are included in the computer 130 (not illustrated in FIG. 1).

The system-specific oscillator 130A is configured to generate, on the system side, a clock (the system clock) of which the amplitude repeatedly fluctuates at a predetermined frequency. For example, the system-specific oscillator 130A supplies the clock to the RF pulse generating unit 108A, the second detecting unit 27, and the image reconstructing unit 130B. It should be noted that the system-specific oscillator 130A is an example of the first clock generating unit.

The RF pulse generating unit 108A is configured to generate the RF pulses by receiving a supply of the system clock from the system-specific oscillator 130A. Further, the RF pulse generating unit 108A outputs the generated RF pulses to the amplifier 108B and the first detecting unit 25.

The amplifier 108B is configured to amplify the RF pulses output from the RF pulse generating unit 108A and to supply the amplified RF pulses to the transmission RF coil 107. The transmission RF coil 107 is configured to generate the radio frequency magnetic field by emitting the RF pulses supplied thereto from the amplifier 108B. In other words, the transmission RF coil 107 emits the RF pulses generated by using the system clock. It should be noted that the system clock is an example of the first clock.

In the reception RF coil 109, the echo signal receiving coil 10A is a coil element configured to receive the echo signals emitted from the patient P due to the influence of the radio frequency magnetic field generated by the transmission RF coil 107. The RF pulse receiving coil 10B is a coil element configured to receive the RF pulses emitted from the transmission RF coil 107. As explained later with reference to FIG. 5 and so on, because the timing with which the echo signals are received is different from the timing with which the RF pulses are received, it means that the either one of the echo signals or one of the RF pulses is output to the amplifier 11.

The amplifier 11 is configured to amplify either each of the echo signals received by the echo signal receiving coil 10A or each of the RF pulses received by the RF pulse receiving coil 10B. The filter 12 is, for example, a Band Pass Filter (BPF) and is configured to perform a filtering process to eliminate noise multiplexed onto either each of the echo signals or each of the RF pulses.

The coil-specific oscillator 13 is configured to generate, on the coil side, a clock (the coil clock) of which the amplitude repeatedly fluctuates at a predetermined frequency. For example, the coil-specific oscillator 13 supplies the coil clock to the A/D converting unit 14 and the encoder 15. It should be noted that the coil-specific oscillator 13 is an example of the second clock generating unit.

The A/D converting unit 14 is configured to apply an A/D conversion process to either each of the echo signals or each of the RF pulses input thereto from the filter 12, by using the coil clock supplied thereto from the coil-specific oscillator 13. In the following explanation, each of the echo signals after the A/D conversion process is applied thereto will be referred to as "MR data", whereas each of the RF pulses after the A/D conversion process is applied thereto will be referred to as "RF data". The A/D converting unit 14 outputs either the MR data or the RF data to the encoder 15.

The encoder 15 is configured to encode either the MR data or the RF data that is output from the A/D converting unit 14 by performing an 8B/10B conversion process, while using the coil clock supplied thereto from the coil-specific oscillator 13. The P/S converting unit 16 is configured to generate a serial signal on which the coil clock is multiplexed, by arranging the data (either the MR data or the RF data) modulated by the encoder 15 and the clock in a time series according to a predetermined bit format. The P/S converting unit 16 outputs the generated serial signal to the wireless transmitting unit 17.

Figure 4:
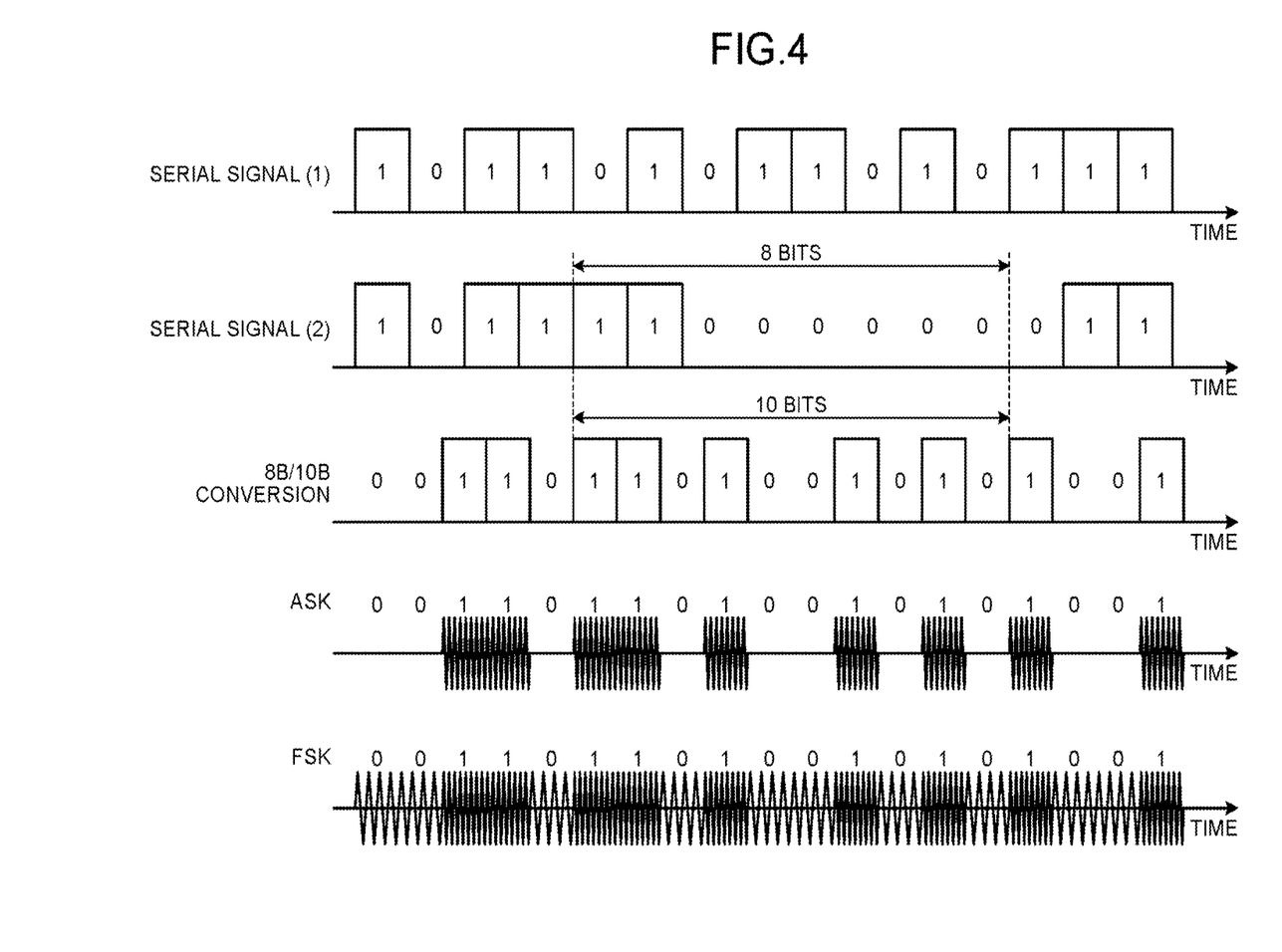
FIG. 4 is a drawing for explaining multiplexing of a coil clock through an 8B/10B conversion process.

FIG. 4 is a drawing for explaining the multiplexing of the coil clock through the 8B/10B conversion process. FIG. 4 illustrates examples of serial signals that are output from the P/S converting unit 16. In FIG. 4, the horizontal axis expresses time. Further, as for 0/1 bit values, 1 is expressed by a high level, whereas 0 is expressed by a low level.

As illustrated in FIG. 4, the P/S converting unit 16 outputs a serial signal in which 0/1 bit values are serially arranged (see serial signal (1) in FIG. 4). In the serial signal, because the signal level fluctuates according to the cycle of the bit values, it is possible to estimate the cycle of the bit values by observing the timing with which the signal level fluctuates. It is therefore possible to reproduce the original coil clock by using the serial signal. However, depending on the series of bit values, there are some situations where a plurality of 0's or a plurality of 1's appear successively, as illustrated by serial signal (2) in FIG. 4. In those situations, it becomes difficult to estimate the cycle of the bit values because the situation where the signal level does not fluctuate lasts for a while. As a result, it becomes difficult to reproduce the coil clock. For this reason, the 8B/10B conversion process is used, which is an encoding method by which the same bit value does not appear in succession longer than a predetermined length (e.g., three or more bits). For example, when the 8B/10B conversion process is applied to the 8-bit information "11000000" in serial signal (2), 10-bit information "1101001010" is output (see the 8B/10B conversion in FIG. 4). As a result, it becomes possible to reproduce the coil clock in a stable manner because the same bit value does not appear in succession longer than the predetermined length. In this situation, because the bit amount increases 10/8 times as a result of the 8B/10B conversion process, the required transfer speed becomes 10/8 higher.

More specifically, when the multiplexing of the coil clock through the 8B/10B conversion process is applied to a wireless communication of either the MR data or the RF data, this function is realized by, for example, an Amplitude Shift Keying (ASK) process by which the amplitude of the signal in the wireless communication is modulated in accordance with the bit values of the serial signal (see ASK in FIG. 4) or a Frequency Shift Keying (FSK) process by which the frequency of the signal is modulated in accordance with the bit values of the serial signal (see FSK in FIG. 4).

The method illustrated in FIG. 4 is merely an example. For instance, the encoding method implemented by the encoder 15 is not limited to the 8B/10B conversion process. It is acceptable to implement a 64B/66B conversion process, a 128B/130B conversion process, or the like. Further, besides these methods, it is also acceptable to construct and implement any other original encoding method by which the same bit value does not appear in succession longer than a predetermined length.

Returning to the description of FIG. 3, the wireless transmitting unit 17 is configured to transmit the serial signal output from the P/S converting unit 16 via a wireless communication. For example, the wireless transmitting unit 17 generates the signal for the wireless transfer (hereinafter, "wireless-transfer-purpose signal"), by performing an encoding process, an amplifying process, and/or the like on the serial signal. The wireless-transfer-purpose signal generated in this situation is an example of the multiplexed signal. The wireless transmitting unit 17 outputs the generated wireless-transfer-purpose signal to the transmission antenna 18 so that the wireless-transfer-purpose signal is transmitted from the transmission antenna 18. In other words, the reception RF coil 109 further receives the RF pulses emitted by the transmission RF coil 107, in addition to the echo signals emitted from the patient, and transmits, via the wireless communication, a multiplexed signal in which the echo signals digitalized by using the coil clock, the received RF pulses, and the coil clock are multiplexed together. In this situation, the coil clock is an example of the second clock.

In the wireless communicating unit 110, when the reception antenna 20 has received the wireless-transfer-purpose signal that was transmitted from the transmission antenna 18, the wireless receiving unit 21 performs a demodulating process, an amplifying process, and/or the like on the received wireless-transfer-purpose signal. The wireless receiving unit 21 thereby demodulates the serial signal in which the coil clock is multiplexed onto either the MR data or the RF data. In other words, the wireless receiving unit 21 receives the multiplexed signal via a wireless communication. The wireless receiving unit 21 outputs the demodulated serial signal to the S/P converting unit 22 and to the clock reproducing unit 26.

The S/P converting unit 22 is configured to perform an S/P conversion process on the serial signal output from the wireless receiving unit 21. The decoder 23 is configured to decode the data on which the S/P conversion process was performed by the S/P converting unit 22, by implementing the 8B/10B conversion method. The decoder 23 thereby decodes either the digitalized MR data or the digitalized RF data. The decoder 23 outputs either the decoded MR data or the decoded RF data to the RF pulse detecting unit 24 and the correcting unit 28.

On the basis of the RF data output from the decoder 23, the RF pulse detecting unit 24 is configured to detect a reception time of the RF pulse corresponding to the RF data. For example, by performing an envelope detection process on the RF data output from the decoder 23, the RF pulse detecting unit 24 obtains an envelope curve of the RF pulse. After that, the RF pulse detecting unit 24 calculates a time at an arbitrary point on the envelope curve as the reception time of the RF pulse. In a specific example, the RF pulse detecting unit 24 obtains a point serving as the center of the RF pulse by obtaining the point at which the symmetry error in the RF pulse is at a minimum. Further, the RF pulse detecting unit 24 calculates the time (the absolute time) of the center as the reception time of the RF pulse. The RF pulse detecting unit 24 outputs the calculated reception time of the RF pulse to the first detecting unit 25.

The first detecting unit 25 is configured to detect the difference between an emission time of the RF pulse emitted by the transmission RF coil 107 and the reception time of the RF pulse received by the reception RF coil 109.

For example, the first detecting unit 25 receives the RF pulse output from the RF pulse generating unit 108A. After that, the first detecting unit 25 detects the emission time of the received RF pulse (e.g., the time of the point serving as the center of the RF pulse). Subsequently, the first detecting unit 25 calculates the difference between the detected emission time of the RF pulse and the reception time of the RF pulse that was output from the RF pulse detecting unit 24. The first detecting unit 25 outputs the calculated difference to the correcting unit 28.

Figure 5:
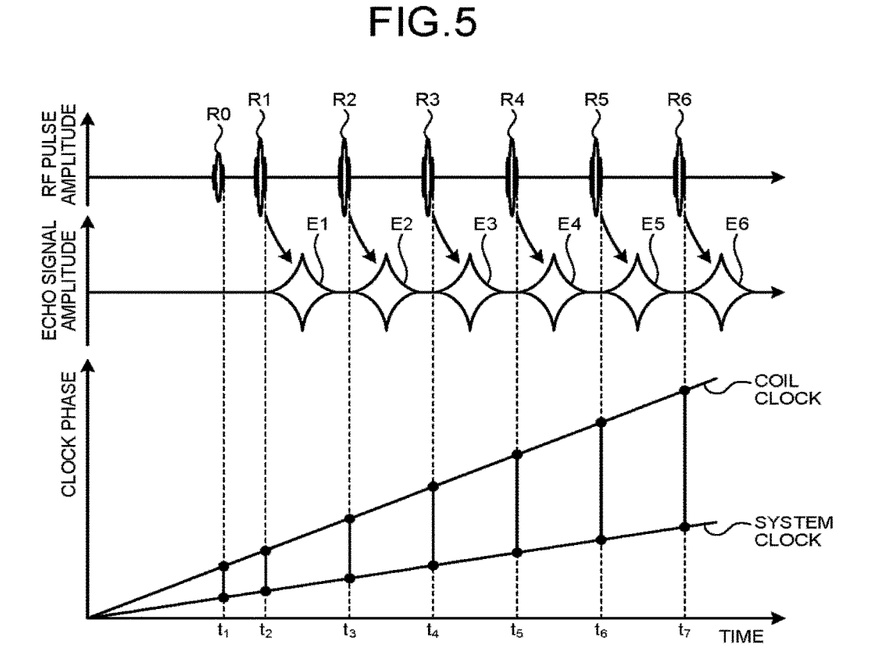
FIG. 5 is a drawing for explaining a process performed by a first detecting unit according to the first embodiment.

FIG. 5 is a drawing for explaining a process performed by the first detecting unit according to the first embodiment. FIG. 5 illustrates a pulse sequence executed by the sequence controlling unit 120 that is set against the frequency error between the clocks. In FIG. 5, the upper section indicates an RF pulse amplitude, while the middle section indicates an echo signal amplitude, and the lower section indicates the clock phases. In FIG. 5, the horizontal axis expresses time. The time in the upper section, the time in the middle section, and the time in the lower section correspond to one another.

In the example illustrated in FIG. 5, at first, a 90-degree pulse R0 is applied as an RF excitation pulse. Following the 90-degree pulse R0, a plurality of 180-degree pulses, namely R1, R2, R3, R4, R5, and R6, are applied at predetermined intervals. By the plurality of 180-degree pulses R1, R2, R3, R4, R5, and R6, echo signals E1, E2, E3, E4, E5, and E6 are generated.

Because each of the RF pulses is a waveform generated by using the system clock, if the coil clock and the system clock are completely in synchronization with each other, the waveform of an RF pulse sampled (received) by the reception RF coil 109 shall be identical to the waveform of the RF pulse generated by the RF pulse generating unit 108A. In other words, if there is a phase difference between the waveforms of the two RF pulses, it is assumed that the phase difference is caused by the frequency error between the coil clock and the system clock. In other words, the first detecting unit 25 makes it possible to correct the frequency error, by detecting the phase difference between the waveforms of the two RF pulses.

More specifically, as illustrated in FIG. 5, at $t_1$, the first detecting unit 25 receives the 90-degree pulse R0 from the RF pulse generating unit 108A. After that, the first detecting unit 25 detects the emission time of the received 90-degree pulse R0 (e.g., the time of the point serving as the center of the RF pulse). Further, the first detecting unit 25 receives the reception time of the 90-degree pulse R0 received by the reception RF coil 109 (the RF pulse receiving coil 10B) from the RF pulse detecting unit 24. After that, the first detecting unit 25 calculates the difference between the emission time and the reception time. The difference corresponds to, in FIG. 5, the line segment connecting together the point on the system clock at $t_1$ and the point on the coil clock at $t_1$. Similarly, for $t_2$ to $t_7$ also, the first detecting unit 25 calculates the difference between the emission times of the 180-degree pulses R1 to R6 and the reception times of the 180-degree pulses R1 to R6 received by the reception RF coil 109.

As explained above, the first detecting unit 25 detects the differences between the emission times at which the RF pulses are emitted and the reception times of the RF pulses received by the reception RF coil 109. As a result, the first detecting unit 25 detects the differences between the absolute times of the coil clock and the system clock that are observed at the times at which the RF pulses are emitted. In this situation, because the emission times of the RF pulses are pieces of known information that are defined in the sequence information in advance, the first detecting unit 25 may obtain the emission times of the received RF pulses from the sequence information.

Returning to the description of FIG. 3, the clock reproducing unit 26 reproduces the coil clock by performing a clock reproducing process on the serial signal output from the wireless receiving unit 21. For example, the clock reproducing unit 26 reproduces the coil clock by detecting the times at which the level of the serial signal output from the wireless receiving unit 21 changes (when the signal rises and falls) and estimating the cycle of the bit values. The clock reproducing unit 26 outputs the reproduced coil clock to the second detecting unit 27.

The second detecting unit 27 is configured to detect the phase difference between the phase of the system clock generated by the system-specific oscillator 130A and the phase of the coil clock received by the wireless receiving unit 21. For example, the second detecting unit 27 receives the system clock output from the system-specific oscillator 130A and also receives the coil clock output from the clock reproducing unit 26. After that, the second detecting unit 27 detects the phase difference between the phase of the received system clock and the phase of the coil clock that were received.

Figure 6:
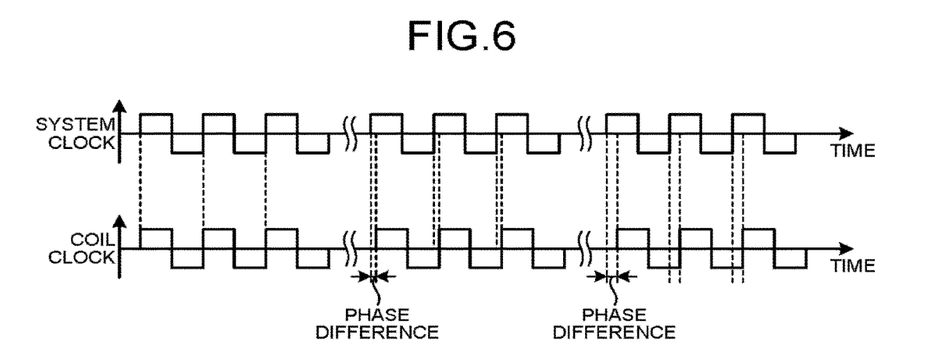
FIG. 6 is a drawing for explaining a process performed by a second detecting unit according to the first embodiment.
Figure 7:
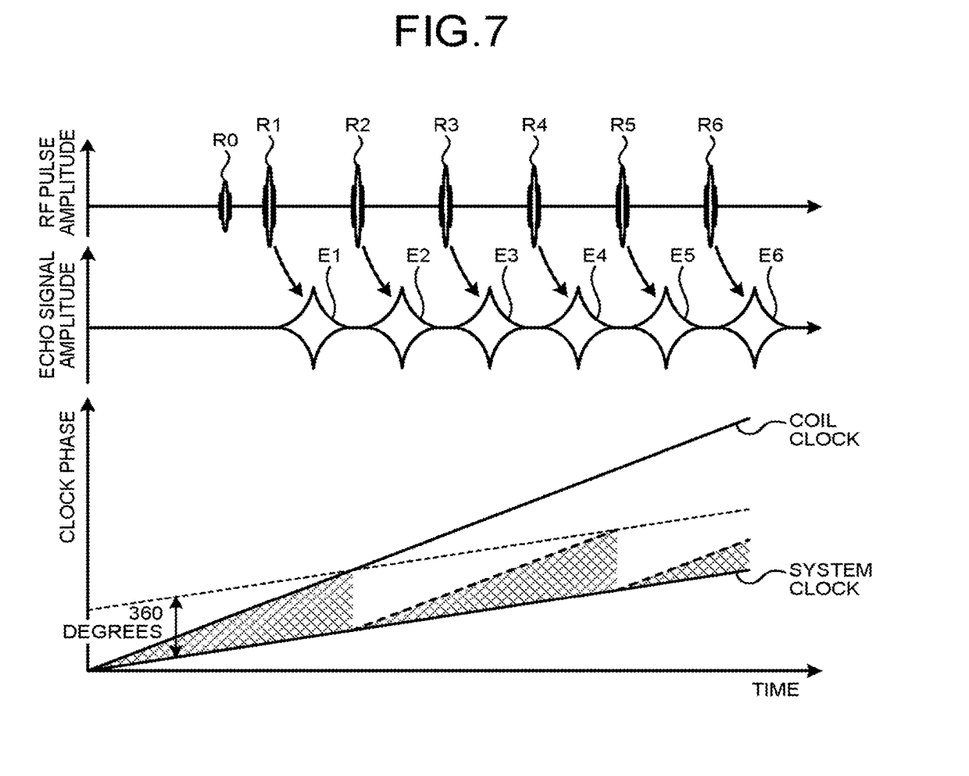
FIG. 7 is another drawing for explaining the process performed by the second detecting unit.

FIGS. 6 and 7 are drawings for explaining a process performed by the second detecting unit 27 according to the first embodiment. FIG. 6 illustrates an example of the phase difference between the system clock and the coil clock. In FIG. 6, the horizontal axis expresses time. FIG. 7 illustrates the pulse sequence executed by the sequence controlling unit 120 that is set against the frequency error between the clocks. In FIG. 7, the upper section indicates the RF pulse amplitude, while the middle section indicates the echo signal amplitude, and the lower section indicates the clock phases. In FIG. 7, the horizontal axis expresses time. The time in the upper section, the time in the middle section, and the time in the lower section correspond to one another.

As illustrated in FIG. 6, when there is a phase difference, the rising times of the clocks exhibit differences (the phase differences) corresponding to the phase difference. For this reason, for example, the second detecting unit 27 detects the phase difference by comparing the rising time between the system clock and the coil clock and calculating the time difference between the two rising times. However, the detecting method is not limited to this example. The second detecting unit 27 may detect the difference in the phase (the phase difference) by performing a discrete Fourier transform on waveforms of a predetermined time period with respect to the system clock and the coil clock and comparing phase values having the same frequency components as the clock frequencies.

As illustrated in FIG. 7, the second detecting unit 27 constantly detects phase differences because the second detecting unit 27 uses the coil clock that is constantly multiplexed and transmitted while the pulse sequence is being executed. It should be noted, however, that the phase differences detected by the second detecting unit 27 are each a phase difference equal to or smaller than 360 degrees (the one cycle of the clock), and the second detecting unit 27 is not able to accurately detect phase differences that are larger than 360 degrees. More specifically, if there is a phase difference larger than 360 degrees, the second detecting unit 27 is not able to distinguish between the value and a value obtained by subtracting an integer multiple of 360 degrees from the value. In other words, the second detecting unit 27 detects a phase difference in 360-degree cycles as illustrated by the hatched regions in FIG. 7.

In the manner described above, the second detecting unit 27 detects the phase difference between the phase of the system clock and the phase of the coil clock. The second detecting unit 27 outputs the detected phase difference to the correcting unit 28.

The correcting unit 28 is configured to correct the echo signals received by the reception RF coil 109, on the basis of the difference detected by the first detecting unit 25 and the phase difference detected by the second detecting unit 27.

Figure 8:
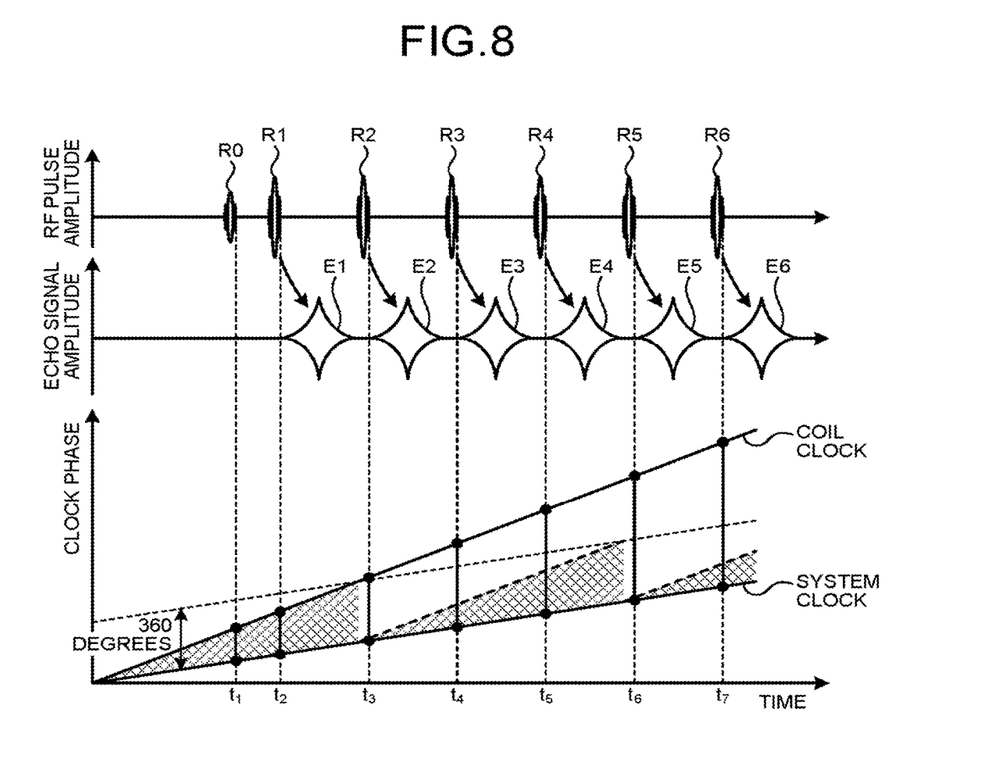
FIG. 8 is a drawing for explaining a process performed by a correcting unit according to the first embodiment.

FIG. 8 is a drawing for explaining a process performed by the correcting unit 28 according to the first embodiment. FIG. 8 illustrates the pulse sequence executed by the sequence controlling unit 120 that is set against the frequency error between the clocks. In FIG. 8, the upper section indicates the RF pulse amplitude, while the middle section indicates the echo signal amplitude, and the lower section indicates the clock phases. In FIG. 8, the horizontal axis expresses time. The time in the upper section, the time in the middle section, and the time in the lower section correspond to one another.

As illustrated in FIG. 8, the correcting unit 28 corrects the phases of the echo signals by using the difference in the absolute time between the coil clock and the system clock at the times at which the RF pulses are emitted (e.g., the times $t_1$ to $t_7$) and the phase difference equal to or smaller than 360 degrees detected by the second detecting unit 27.

More specifically, an example will be explained in which the echo signal received between $t_4$ and $t_5$ is to be corrected. In that situation, the correcting unit 28 calculates how many clock cycles the difference between the phases of the two clocks corresponds, by using the difference in the absolute time between the coil clock and the system clock at $t_4$. In the example illustrated in FIG. 8, it is calculated that the phases are different by more than one clock cycle. Further, the correcting unit 28 calculates a phase difference larger than 360 degrees, by adding 360 degrees (corresponding to one clock cycle) to the phase difference between $t_4$ and $t_5$ detected by the second detecting unit 27. After that, by using the calculated phase difference larger than 360 degrees, the correcting unit 28 corrects the phase of the echo signal corresponding to the MR data output from the decoder 23. The correcting unit 28 outputs the corrected MR data to the image reconstructing unit 130B. In other words, the correcting unit 28 corrects the phase of the echo signal, on the basis of the RF pulse and the coil clock restored from the multiplexed signal received via the wireless communication. More specifically, the correcting unit 28 corrects the phase of the echo signal, on the basis of the phase difference between the system clock and the coil clock and the difference between the emission time of the RF pulse emitted by the transmission RF coil 107 and the reception time of the RF pulse received by the reception RF coil 109.

Returning to the description of FIG. 3, the image reconstructing unit 130B is configured to reconstruct an image on the basis of the echo signals corrected by the correcting unit 28. For example, the image reconstructing unit 130B generates spectrum data or image data corresponding to a desired nuclear spin on the inside of the patient P, by performing a reconstructing process such as a Fourier transform, on the MR data output from the correcting unit 28. In other words, the image reconstructing unit 130B reconstructs the image by using the corrected echo signals. The reconstructing process performed by the image reconstructing unit 130B may be realized by using any conventional technique.

The configuration illustrated in FIG. 3 is merely an example. For instance, although FIG. 3 illustrates the example in which, for the convenience in the illustration with the diagram, the reception RF coil 109 includes the one echo signal receiving coil 10A; however, the reception RF coil 109 may include any arbitrary number of echo signal receiving coils 10A. Further, the number of amplifiers 11 and the number of filters 12 may be increased in accordance with the number of coil elements (the echo signal receiving coil 10A and the RF pulse receiving coil 10B), so that one amplifier 11 and one filter 12 are provided for each of the coil elements.

As explained above, in the MRI apparatus 100 according to the first embodiment, the system-specific oscillator 130A is configured to generate the system clock. The transmission RF coil 107 is configured to emit the RF pulses generated on the basis of the system clock. The reception RF coil 109 includes the coil-specific oscillator 13 configured to generate the coil clock and is configured to receive the RF pulses emitted by the transmission RF coil 107 and the echo signals emitted from the patient P due to the emission of the RF pulses and configured to multiplex the coil clock together with the RF pulses and the echo signals received and to transmit the multiplexed result via the wireless communication. The wireless receiving unit 21 is configured to receive, via the wireless communication, the RF pulses, the echo signals, and the coil clock transmitted by the reception RF coil 109. The first detecting unit 25 is configured to detect the difference between the emission times of the RF pulses emitted by the transmission RF coil 107 and the reception times of the RF pulses received by the reception RF coil 109. The second detecting unit 27 is configured to detect the phase difference between the phase of the system clock generated by the system-specific oscillator 130A and the phase of the coil clock received by the wireless receiving unit 21. The correcting unit 28 is configured to correct the phases of the echo signals received by the reception RF coil 109, on the basis of the difference detected by the first detecting unit 25 and the phase difference detected by the second detecting unit 27. The image reconstructing unit 130B is configured to reconstruct the image on the basis of the echo signals corrected by the correcting unit 28. Thus, the MRI apparatus 100 according to the first embodiment is able to prevent the image quality from being degraded by the frequency error between the clocks.

For example, the MRI apparatus 100 according to the first embodiment is configured to detect the phase difference between the coil clock and the system clock. Further, the MRI apparatus 100 is configured to correct the phase differences in the echo signals caused by the frequency error, in accordance with the detected phase difference. As a result, the MRI apparatus 100 is able to prevent the image quality from being degraded by the frequency error between the clocks.

Further, for example, the reception RF coil 109 includes the RF pulse receiving coil 10B configured to receive the RF pulses, separately from the echo signal receiving coil 10A configured to receive the echo signals. Thus, the reception RF coil 109 is able to properly receive the echo signals and the RF pulses.

Second Embodiment

In the first embodiment described above, the example is explained in which the one wireless communicating unit 110 is provided for the one reception RF coil 109; however, possible embodiments are not limited to this example. For instance, the MRI apparatus 100 may include two or more of the wireless communicating units 110.

Figure 9:
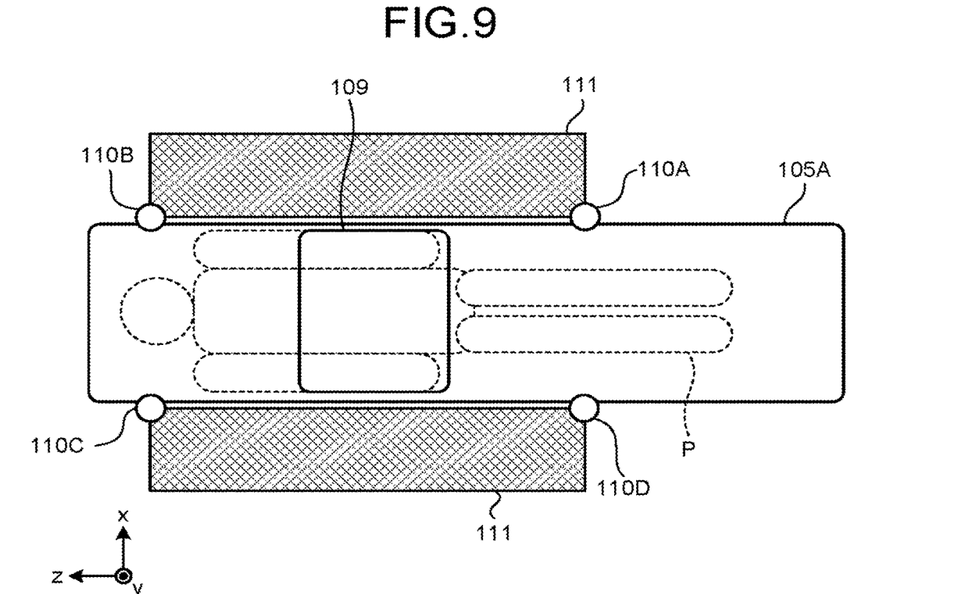
FIG. 9 is a drawing of an exemplary configuration inside a bore of an MRI apparatus according to a second embodiment.

FIG. 9 is a drawing of an exemplary configuration inside the bore of the MRI apparatus 100 according to a second embodiment. FIG. 9 illustrates an example in which the MRI apparatus 100 includes four wireless communicating units, namely wireless communicating units 110A, 110B, 110C, and 110D. In this situation, the bore refers to the space on the inside of a gantry 111 into which the couch top 105A is inserted. In FIG. 9, the areas indicated with hatching represent a cross section of the gantry 111. In the example illustrated in FIG. 9, the wireless communicating units 110A and 110D are arranged on such ends of the bore in the axial direction that are positioned on the side having the couch 105 (i.e., the couch side), whereas the wireless communicating units 110B and 110C are arranged on the side that does not have the couch 105 (i.e., the side opposite from the couch side). Further, with reference to FIG. 9, the example will be explained in which one reception RF coil 109 is used with the main body of the one MRI apparatus 100. When being referred to without being distinguished from one another, the four wireless communicating units 110A, 110B, 110C, and 110D will be referred to as "wireless communicating units 110".

In the example illustrated in FIG. 9, the reception RF coil 109 is configured to transmit wireless-transfer-purpose signals to the four wireless communicating units 110A, 110B, 110C, and 110D. In that situation, the computer 130 is configured to, for example, perform the process of comparing the signal intensities among the wireless-transfer-purpose signals received by the wireless communicating units 110 and generating an image by using the signal having the highest signal intensity. For example, if two or more wireless communicating units 110 are present, the image reconstructing unit 130B generates the image by using the signal having the highest signal intensity among the signals received by the two or more wireless communicating units 110.

As explained above, the MRI apparatus 100 according to the second embodiment includes the plurality of wireless communicating units 110. Further, the MRI apparatus 100 is configured to reconstruct the image by using the signal having the highest signal intensity among the signals received by the wireless communicating units 110. Accordingly, the MRI apparatus 100 is able to generate the image by using the signal having less noise caused by the wireless communication. Further, even if the wireless communication with a part of the wireless communicating units 110 is interrupted, the MRI apparatus 100 is able to generate an image by using a signal received by any other wireless communicating unit 110.

Third Embodiment

The present disclosure is not limited to the first and the second embodiments described above. It is also acceptable to provide two or more wireless communicating units 110 with respect to two or more reception RF coils 109.

Figure 10:
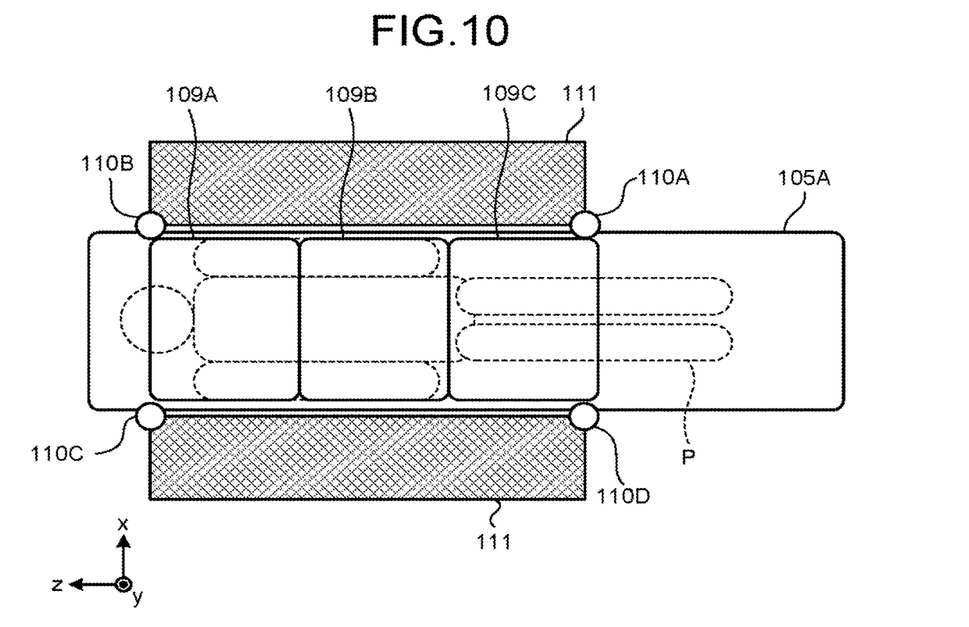
FIG. 10 is a drawing of an exemplary configuration inside a bore of an MRI apparatus according to a third embodiment.

FIG. 10 is a drawing of an exemplary configuration inside the bore of the MRI apparatus 100 according to a third embodiment. FIG. 10 illustrates an example in which the MRI apparatus 100 includes the four wireless communicating units 110A, 110B, 110C, and 110D, while three reception RF coils 109 (namely, 109A, 109B, and 109C) are employed. In FIG. 10, the areas indicated with hatching represent a cross section of the gantry 111. In the example illustrated in FIG. 10, the wireless communicating units 110A and 110D are arranged on such ends of the bore in the axial direction that are positioned on the side having the couch 105 (i.e., the couch side), whereas the wireless communicating units 110B and 110C are arranged on the side that does not have the couch 105 (i.e., the side opposite from the couch side). When being referred to without being distinguished from one another, the three reception RF coils 109A, 109B, and 109C will be referred to as "reception RF coils 109".

In the example illustrated in FIG. 10, each of the three reception RF coils 109A, 109B, and 109C is configured to transmit a wireless-transfer-purpose signal to each of the four wireless communicating units 110A, 110B, 110C, and 110D. In that situation, each of the wireless communicating units 110 receives pieces of information transmitted from the reception RF coils 109 via wireless communications, in a multiplexed manner. For example, each of the wireless communicating units 110 receives the pieces of information in the multiplexed manner by using any of the following: a Frequency Division Multiplexing (FDM) method by which the information is multiplexed by varying the transmission frequency; a Space Division Multiplexing (SDM) method by which a plurality of transmission antennas are provided so that the information is spatially multiplexed by arranging the directionalities of the transmission antennas to be directed in mutually-different directions; a Time Division Multiplexing (TDM) method by which the transmitted information is received at mutually-different times, and the like.

As explained above, in the MRI apparatus 100 according to the third embodiment, each of the wireless communicating units 110 is configured to receive, in the multiplexed manner, the pieces of information transmitted from the plurality of reception RF coils 109 via the wireless communications. Accordingly, even if the plurality of reception RF coils 109 are employed, the MRI apparatus 100 is able to prevent the image quality from being degraded by the frequency error between the clocks.

In the exemplary embodiments above, the example is explained in which the phases of the echo signals are corrected by using together the method by which the phase difference between the clocks is detected by using the RF pulses and the method by which the phase difference is detected by multiplexing the coil clock; however, possible embodiments are not limited to this example. For instance, the MRI apparatus 100 is able to correct the phases of the echo signals also when using only the method by which the phase difference is detected by multiplexing the coil clock.

Further, in the exemplary embodiments above, the example is explained in which the clock is corrected by using the 90-degree pulse R0 and the 180-degree pulses R1 to R6; however, possible embodiments are not limited this example. For instance, the MRI apparatus 100 does not necessarily have to use all of the 90-degree pulse R0 and the 180-degree pulses R1 to R6, when correcting the clock. In an example, the MRI apparatus 100 may correct the clock by thinning out the pulses by eliminating arbitrary one or more of the RF pulses generated by the transmission RF coil 107. When acquiring the echo signals E1 to E6 generated from the 180-degree pulses R1 to R6 (see FIG. 8), the MRI apparatus 100 may correct the clock by using the 180-degree pulses R2, R4, and R6, by eliminating the 180-degree pulses R1, R3, and R5 so as to thin out the clock-correcting RF pulses. However, to perform the clock correcting process more precisely, it is desirable not to thin out the RF pulses.

Further, for example, it is also acceptable to generate clock-correcting RF pulses, separately from the 90-degree pulse R0 and the 180-degree pulses R1 to R6. It should be noted, however, that the clock-correcting RF pulses are generated with timing different from the timing (the times) with which the echo signals are received, to ensure that the clock-correcting RF pulses make no impact on the echo signals. In the example illustrated in FIG. 8, for instance, the transmission RF coil 107 is able to transmit the clock-correcting RF pulses in time periods such as the time period between the echo signal E1 and the 180-degree pulse R2 and the time period between the echo signal E2 and the 180-degree pulse R3.

In other words, to perform the clock correcting process more precisely without making any impact on the echo signals, it is preferable to correct the clock by using the 90-degree pulse R0 and the 180-degree pulses R1 to R6, as explained in the above embodiments. In other words, the reception RF coil 109 receives, as the RF pulses, the echo-signal-generating RF pulses emitted for the purpose of generating the echo signals and transmits the multiplexed signal containing the received echo-signal-generating RF pulses via the wireless communication. Further, the wireless receiving unit 21 receives the multiplexed signal containing the echo-signal-generating RF pulses via the wireless communication. Further, the correcting unit 28 corrects the phases of the echo signals, on the basis of the echo-signal-generating RF pulses and the coil clock restored from the multiplexed signal.

According to at least one aspect of the embodiments described above, it is possible to prevent the image quality from being degraded by the frequency error between the clocks.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A magnetic resonance imaging apparatus comprising:
a transmission RF coil configured to emit an RF pulse generated by using a first clock;
a reception RF coil configured to
receive an echo signal emitted from a patient and the RF pulse emitted by the transmission RF coil;
digitize the echo signal and the RF pulse to magnetic resonance (MR) data and RF data respectively by using a second clock; and
transmit, via a wireless communication, a multiplexed signal in which the MR data and the RF data are multiplexed with the second clock;
wireless receiving circuitry configured to receive the multiplexed signal via the wireless communication;
a decoder configured to decode the MR data, the RF data, and the second clock from the multiplexed signal received via the wireless receiving circuitry;
correcting circuitry configured to correct a phase of the MR data by using the second clock decoded from the multiplexed signal; and
reconstructing circuitry configured to reconstruct an image by using the MR data corrected by the correcting circuitry.

2. The magnetic resonance imaging apparatus according to claim 1, wherein the correcting circuitry is configured to correct the phase of the echo signal on a basis of a phase difference between the first clock and the second clock and a difference between an emission time of the RF pulse emitted by the transmission RF coil and a reception time of the RF pulse received by the reception RF coil.

3. The magnetic resonance imaging apparatus according to claim 1, further comprising:
first clock generating circuitry configured to generate the first clock, wherein
the reception RF coil is further configured to include second clock generating circuitry configured to generate the second clock.

4. The magnetic resonance imaging apparatus according to claim 2, further comprising:
first clock generating circuitry configured to generate the first clock, wherein
the reception RF coil is further configured to include second clock generating circuitry configured to generate the second clock.

5. The magnetic resonance imaging apparatus according to claim 1, wherein the reception RF coil is configured to include an RF pulse receiving coil element configured to receive the RF pulse, separately from an echo signal receiving coil element configured to receive the echo signal.

6. The magnetic resonance imaging apparatus according to claim 2, wherein the reception RF coil is configured to include an RF pulse receiving coil element configured to receive the RF pulse, separately from an echo signal receiving coil element configured to receive the echo signal.

7. The magnetic resonance imaging apparatus according to claim 1, wherein, if two or more of the wireless receiving circuitry are present, the reconstructing circuitry is further configured to reconstruct the image by using a signal having a highest signal intensity among signals received by the two or more wireless receiving circuitry.

8. The magnetic resonance imaging apparatus according to claim 2, wherein, if two or more of the wireless receiving circuitry are present, the reconstructing circuitry is further configured to reconstruct the image by using a signal having a highest signal intensity among signals received by the two or more wireless receiving circuitry.

9. The magnetic resonance imaging apparatus according to claim 1, wherein, if two or more of the reception RF coils are present, the wireless receiving circuitry is configured to receive pieces of information transmitted via wireless communications from the two or more reception RF coils in a multiplexed manner.

10. The magnetic resonance imaging apparatus according to claim 2, wherein, if two or more of the reception RF coils are present, the wireless receiving circuitry is configured to receive pieces of information transmitted via wireless communications from the two or more reception RF coils in a multiplexed manner.

11. The magnetic resonance imaging apparatus according to claim 1, wherein
the reception RF coil is configured to receive, as the RF pulse, an echo-signal-generating RF pulse emitted for a purpose of generating the echo signal, digitize the received echo-signal-generating FR pulse to echo-signal-generating RF data as the RF data, and transmit the multiplexed signal containing the echo-signal-generating RF data, via the wireless communication,
the wireless receiving circuitry is configured to receive the multiplexed signal containing the echo-signal-generating RF data, via the wireless communication, and
the correcting circuitry is configured to correct the phase of the MR data on a basis of the echo-signal-generating RF data and the second clock decoded from the multiplexed signal.

12. The magnetic resonance imaging apparatus according to claim 2, wherein
the reception RF coil is configured to receive, as the RF pulse, an echo-signal-generating RF pulse emitted for a purpose of generating the echo signal, digitize the received echo-signal-generating RF pulse to echo-signal-generating RF data as the RF data, and transmit the multiplexed signal containing the echo-signal-generating RF data, via the wireless communication,
the wireless receiving circuitry is configured to receive the multiplexed signal containing the echo-signal-generating RF data, via the wireless communication, and
the correcting circuitry is configured to correct the phase of the echo signal on a basis of the echo-signal-generating RF data and the second clock decoded from the multiplexed signal.

13. An RF coil configured to:
receive an echo signal emitted from a patient and an RF pulse emitted by a transmission RF coil that emits the RF pulse generated by using a first clock;
digitize the echo signal and the RF pulse to magnetic resonance (MR) data and RF data respectively by using a second clock; and
transmit, via a wireless communication, a multiplexed signal in which the MR data and the RF data are multiplexed with the second clock.

14. A magnetic resonance imaging apparatus comprising:
a transmission RF coil configured to emit an RF pulse generated by using a first clock;
wireless receiving circuitry configured to receive a multiplexed signal which is transmitted by a reception RF coil via a wireless communication, wherein the reception RF coil receives an echo signal emitted from a patient and the RF pulse emitted by the transmission RF coil, digitize the echo signal and the RF pulse to magnetic resonance (MR) data and RF data respectively by using a second clock, and transmit, via the wireless communication, a multiplexed signal in which the MR data and the RF data are multiplexed with the second clock;
a decoder configured to decode the MR data, the RF data, and the second clock from the multiplexed signal received via the wireless receiving circuitry;
correcting circuitry configured to correct a phase of the MR data by using the second clock decoded from the multiplexed signal; and
reconstructing circuitry configured to reconstruct an image by using the MR data corrected by the correcting circuitry.

* * * * *